(12) United States Patent
Gleason

(10) Patent No.: US 6,709,980 B2
(45) Date of Patent: Mar. 23, 2004

(54) USING STABILIZERS IN ELECTROLESS SOLUTIONS TO INHIBIT PLATING OF FUSES

(75) Inventor: Jeffrey N. Gleason, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/154,755

(22) Filed: May 24, 2002

(65) Prior Publication Data

US 2003/0219976 A1 Nov. 27, 2003

(51) Int. Cl.$^7$ ............................................. H01L 21/44
(52) U.S. Cl. ...................... 438/678; 438/601; 438/281; 438/13
(58) Field of Search ................................ 438/601, 678, 438/281, 13; 257/748, 762, 766, 784; 106/1.26, 1.22, 1.13

(56) References Cited

U.S. PATENT DOCUMENTS

| | | | |
|---|---|---|---|
| 5,203,911 A | * | 4/1993 | Sricharoenchaikit et al. .... 106/1.26 |
| 5,258,062 A | * | 11/1993 | Nakazawa et al. ......... 106/1.23 |
| 6,043,966 A | | 3/2000 | Krueger et al. |
| 6,235,557 B1 | | 5/2001 | Manley |
| 6,277,674 B1 | | 8/2001 | Wang et al. |
| 6,300,242 B1 | | 10/2001 | Ueda et al. |
| 6,323,534 B1 | | 11/2001 | Marr et al. |
| 6,335,626 B1 | | 1/2002 | Motulla |
| 6,403,457 B2 | * | 6/2002 | Tandy ........................ 438/613 |
| 2002/0011666 A1 | * | 1/2002 | Tandy ......................... 257/738 |
| 2003/0003703 A1 | * | 1/2003 | Hans-Joachim Barth et al. 438/601 |

OTHER PUBLICATIONS

INCO Newsletter, "Nickel Currents," vol. 6, No. 2, (1999), pp. 1–4.*
Cascade Microtech Technical Data Sheet, "Challenges of Conventional Wafer Probing," (2002).*
Christopher L. Henderson, Jerry M. Soden, and Charles F. Hawkins, "The Behavior and Testing Implications of CMOS IC Open Circuits," Proc. International Test Conference, (1991), pp. 1–11.*

* cited by examiner

Primary Examiner—Tom Thomas
Assistant Examiner—Thomas Magee
(74) Attorney, Agent, or Firm—TraskBritt

(57) ABSTRACT

The present invention relates to a method of forming a metal feature on an intermediate structure of a semiconductor device that comprises a first exposed metal structure and a second exposed metal structure. The metal feature is selectively formed on the first exposed metal structure without forming on the second exposed metal structure. By adjusting a concentration of stabilizer in an electroless plating solution, the metal feature is electrolessly plated on the first exposed metal structure without plating metal on the second exposed metal structure.

42 Claims, 1 Drawing Sheet

USING STABILIZERS IN ELECTROLESS SOLUTIONS TO INHIBIT PLATING OF FUSES

BACKGROUND OF THE INVENTION

1. Field of the Invention

The present invention relates to forming a metal feature on an intermediate structure of a semiconductor device and, more specifically, to a method of selectively forming a metal feature on a first exposed metal structure of the intermediate structure without forming metal on a second exposed metal structure.

2. State of the Art

Fuses or fusible links are commonly used to connect electrical components on the surface of a semiconductor device with conductive traces to form circuit assemblies. Fuses are also used to provide a level of redundancy in the semiconductor device. For example, if a defective portion of the semiconductor device is found during testing or probe, the fuse connecting that portion is opened or blown, making that portion nonfunctional. However, since the semiconductor device is fabricated with many portions that perform the same function, the semiconductor device still functions after the fuse is opened. By building redundancies into semiconductor devices, manufacturers can increase their yields because devices that otherwise would be defective can still be used.

In intermediate structures of certain semiconductor devices, such as static random access memory ("SRAM") and FLASH memory chips, fuses are exposed at the wafer level. The fuses are typically formed from conductive materials such as metals or polysilicon. The fuse is opened, or "blown," by exposure to a laser beam or electrical current, which causes the metal or polysilicon to rapidly heat up and vaporize. This vaporized material is scattered and deposited across areas of the intermediate structure. In addition to causing shorts, the vaporized material may be undesirably deposited on the blown ends of the opened fuse, thereby reforming the two ends. The ends of the opened fuse may also be reformed if metal features are formed on the intermediate structure after the fuse has been opened. For example, metal of the metal feature may reform the fuse by spanning between the two, opened ends. Since the formation of metal features is necessary to electrically connect the semiconductor device, reformation of fuses opened during probe testing is problematic.

The aforementioned metal features may be formed by various techniques, depending on the desired semiconductor device. For example, the metal feature may be formed by chemical vapor deposition ("CVD"), physical vapor deposition ("PVD"), electroplating, or electroless plating. Electroless plating is used in the semiconductor industry to deposit thin, metal layers or features on the semiconductor device. Electroless plating is advantageous over other plating techniques because the plated metal is uniformly deposited and evenly coats all surfaces, including edges and corners. In contrast to electroplating, electroless plating does not utilize an electrical current to deposit the metal. However, electroless plating can only be used with particular metals because the metal must be catalytic in order to sustain the plating reaction. Metals that may be electrolessly plated include, but are not limited to, copper, nickel, palladium, tin, silver, and gold.

To electrolessly plate a metal feature on the intermediate structure, the intermediate structure is placed in an electroless plating solution that comprises metal ions, reducing agents, complexing agents, accelerators, and stabilizers. In the plating reaction, the metal ions are reduced to metal by oxidation of the reducing agent. The rate of deposition of the metal depends on the concentrations of the components of the electroless plating solution. For example, the concentration of stabilizer controls the plating reaction so that the metal is deposited at a predictable rate and on desired surfaces. The concentration of stabilizer also controls the rate of growth of the metal so that the metal is grown as a flat surface, rather than having dendritic growth. As disclosed in U.S. Pat. No. 6,335,626 to Motulla, the stabilizer concentration also affects the morphology of a contact metallization deposited on a terminal area.

Stabilizers used in electroless plating solutions include compounds of group VI elements, compounds containing oxygen, heavy metal cations, and unsaturated organic acids. Compounds comprising group VI elements that are used as stabilizers include, but are not limited to, sulfur, selenium, or tellurium compounds. Thiourea is a sulfur compound commonly used as a substrate. Compounds comprising oxygen that are used as stabilizers include, but are not limited to, $AsO_2^-$, $IO_3^-$, $NO_2^-$, $BrO_3^-$, or $MoO_4^-$. These anions may be used as potassium or sodium salts. Heavy metal cations including, but not limited to, Sn, Pb, Hg, or Sb are also used as stabilizers. Unsaturated organic acids including, but not limited to, maleic acid or itaconic acid are also used as stabilizers.

Many semiconductor manufacturers are starting to use copper in semiconductor devices, rather than aluminum. Copper wires are replacing aluminum wires because copper is more conductive and allows higher frequencies to be used with smaller linewidths. Copper is also replacing aluminum as the metal in bond pads. However, it is harder to create wirebonds to copper. With aluminum, ultrasonic vibrations are used to create an effective bond by breaking through aluminum oxide that forms on an aluminum bond pad's surface. However, copper oxide is less brittle than aluminum oxide and, therefore, ultrasonic vibrations do not break through the copper oxide that forms on a copper bond pad's surface. Rather, the copper oxide is ductile, with weak adherence to the metal's surface, and the vibrations cause the wires to slide on the bond pad surface.

One method of wirebonding to copper comprises first forming a thin layer of another metal over the copper. The metal layer, which comprises aluminum, palladium, nickel, or gold, forms a cap structure over the copper. These metals are typically electrolessly plated or immersion plated onto the copper. The copper may also be capped or coated with multiple layers of metals, such as an interconnect cap. For example, the copper is capped with a thin layer of palladium, a thin layer of nickel, and a thin layer of gold, in ascending order. However, one disadvantage associated with these plating steps is that the metals used in the interconnect cap are also plated onto other metal portions of the semiconductor device. For example, if a fuse on the semiconductor device has been opened, the metals used in the interconnect cap plate on and between the ends of the opened fuses, thereby reforming the fuse.

In light of the problems discussed above, it would be advantageous to form a metal feature on a semiconductor device without the metal of the metal feature forming on other portions of the semiconductor device. Specifically, it would be advantageous to electrolessly plate a metal feature onto the semiconductor device without the metal of the metal feature plating other portions of the semiconductor device.

BRIEF SUMMARY OF THE INVENTION

The present invention relates to a method of forming a metal feature on an intermediate structure of a semiconductor device that comprises a first exposed metal structure and a second exposed metal structure. By adjusting a concentration of stabilizer in an electroless plating solution, the metal feature may be formed on the first exposed metal structure without any metal of the metal feature being formed on the second exposed metal structure.

In a more specific implementation, the method includes selectively forming a metal feature on an intermediate structure of a semiconductor device that has been probed or otherwise tested. The method comprises providing the intermediate structure having a first exposed metal structure and a second exposed metal structure. The metal feature is electrolessly plated on the first exposed metal structure by adjusting a concentration of stabilizer in an electroless plating solution. The metal feature may comprise a metal layer, an interconnect cap, a redistribution layer, or a bond pad.

The stabilizer may be selected from compounds of group VI elements, compounds comprising oxygen, heavy metal cations, or unsaturated organic acids. The concentration of stabilizer may be either increased or decreased to selectively plate the metal feature. If the stabilizer concentration is increased, a critical size of the first exposed metal structure is decreased and a size of the metal feature is decreased. If the stabilizer concentration is decreased, the critical size of the first exposed metal structure is increased and a size of the metal feature is increased.

The intermediate structure may be an intermediate structure of an SRAM or FLASH memory chip that comprises at least one bond pad and at least one opened fuse. The metal feature is electrolessly plated onto the at least one bond pad, without reforming the opened fuse, by adjusting the concentration of stabilizer.

The present invention also comprises a method of optimizing an electroless plating solution to selectively plate a metal feature on a first exposed metal structure of an intermediate structure. The method comprises providing the electroless plating solution comprising a stabilizer. The concentration of stabilizer is adjusted to electrolessly plate the metal feature on the first exposed metal structure without depositing the metal of the metal feature on a second exposed metal structure. The first exposed metal structure and the second exposed metal structure may be viewed by scanning electron microscopy ("SEM") to determine whether the metal feature is selectively plated on the first exposed metal structure.

The present invention also includes an intermediate structure of a semiconductor device. The intermediate structure comprises at least one opened fuse and a metal feature that has been electrolessly plated on a first exposed metal structure of the intermediate structure. Specifically, the first exposed metal structure comprises a copper bond pad that has been electrolessly plated with a nickel layer without reforming the at least one opened fuse.

DESCRIPTION OF THE DRAWINGS

By way of example, an embodiment of the invention will be described with reference to the accompanying drawing.

DETAILED DESCRIPTION OF THE INVENTION

Figure 1A:
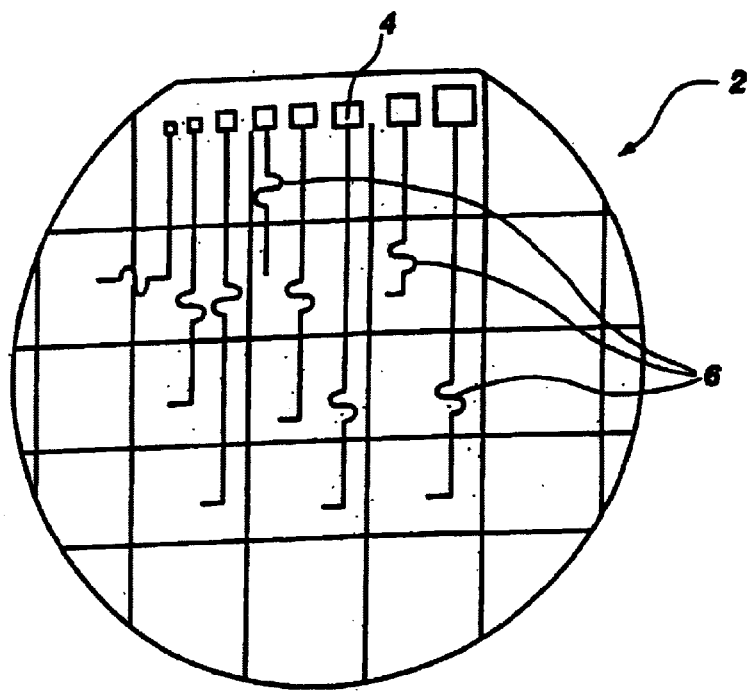
FIGS. 1A and 1B show a schematic representation of a semiconductor wafer used in the present invention.

The present invention relates to a method of forming a metal feature on an intermediate structure of a semiconductor device. The intermediate structure comprises a first exposed metal structure and a second exposed metal structure. The metal feature is formed on the first exposed metal structure, without forming metal on the second exposed metal structure, by electrolessly plating the metal of the metal feature. The metal of the metal feature is selectively plated on the first exposed metal structure by adjusting the concentration of stabilizer in an electroless plating solution.

The present invention also relates to a method of optimizing an electroless plating solution to selectively plate a metal feature on a first exposed metal structure of an intermediate structure. The method comprises providing the electroless plating solution, which comprises a stabilizer. The concentration of stabilizer is adjusted to electrolessly plate the metal feature on the first exposed metal structure without depositing the metal of the metal feature on a second exposed metal structure. The first exposed metal structure and the second exposed metal structure may be viewed by SEM to determine whether the metal feature is selectively plated on the first exposed metal structure.

The present invention also relates to an intermediate structure of a semiconductor device. The intermediate structure comprises at least one opened fuse and a metal feature formed on a first exposed metal structure by electroless plating. Preferably, the metal feature is formed after probe testing.

The intermediate structure of the semiconductor device may comprise a first exposed metal structure and a second exposed metal structure. The first exposed metal structure may be an exposed metal structure present on the surface of the intermediate structure and may be the surface upon which formation of the metal feature occurs. The second exposed metal structure may be a smaller structure upon which formation of the metal feature is not desired. In one exemplary embodiment, discussed herein, the first exposed metal structure is a metal bond pad, or interconnect pad, and the second exposed metal structure is an opened fuse. The bond pad may be rectangular and have dimensions of 40–80 $\mu$m by 40–80 $\mu$m. In this embodiment, the intermediate structure of the semiconductor device comprises an intermediate structure of a memory chip, such as an SRAM or FLASH memory, wherein fuses are exposed at the wafer level.

The metal feature may be selectively formed on the first exposed metal structure without forming the metal of the metal feature on the second exposed metal structure. Preferably, the metal feature is formed on the first exposed metal structure by electroless plating. Therefore, the first exposed metal structure preferably comprises a metal that provides an appropriate surface for electroless plating. The second exposed metal structure also preferably comprises a metal that provides an appropriate surface for electroless plating.

The metal feature to be electrolessly plated on the first exposed metal structure may include, but is not limited to, a metal layer, an interconnect cap, a redistribution layer ("RDL"), or a bond pad. The interconnect cap may comprise multiple metal layers, at least one of which is electrolessly plated, while the other layers may be formed by techniques such as immersion plating. The metal feature is comprised of a metal that may be electrolessly plated including, but not limited to, copper, palladium, nickel, tin, silver, or gold. It is also contemplated that more than one metal feature may be electrolessly plated on the intermediate structure. For example, multiple metal features of the same or different types may be plated on the intermediate structure. If different types of metal features are formed, they may each be formed from the same or a different metal.

To electrolessly plate the metal feature on the first exposed metal structure without plating the metal on the second exposed metal structure, the intermediate structure may be placed in the electroless plating solution. The electroless plating solution may be chosen based on the metal and the size of the metal feature to be plated, as known in the art. In addition, the stabilizer(s) in the electroless plating solution may be chosen based on the metal to be plated. The stabilizers may comprise group VI elements, compounds containing oxygen, heavy metal cations, and unsaturated organic acids. It is also contemplated that the electroless plating solution may comprise more than one stabilizer to achieve the desired plating selectivity. If two or more stabilizers are used, the stabilizers may be selected from one of the previously disclosed categories or from multiple categories.

For sake of example only, if a nickel metal feature is to be plated on the first exposed metal structure, an electroless nickel ("EN") plating solution may be used. The EN plating solution may comprise nickel salts, such as nickel sulfate, nickel sulfamate, or nickel chloride, as a source of the nickel ions. The stabilizers in the solution may be metallic (inorganic) or organic. Metallic stabilizers commonly used in electroless nickel plating solutions include Pb, Sn, or Mo compounds, such as lead acetate. Organic stabilizers commonly used include sulfur compounds ("S compounds"), such as thiourea. The reducing agents may comprise hypophosphite or boranes such as dimethylaminobenzaldehyde ("DMAB"). The complexing agents may include citric acid, lactic acid, or malic acid.

By adjusting the concentration of stabilizer(s) in the electroless plating solution, the metal feature may be selectively plated onto the first exposed metal structure. The metal feature may be plated onto the first exposed metal structure, without plating the second exposed metal structure, even if both exposed metal structures comprise a metal surface that catalyzes electroless plating. By increasing the stabilizer concentration, the critical size of the first exposed metal structure and the size of the metal feature to be plated may be decreased. Stated another way, increasing the stabilizer concentration may decrease the smallest plateable feature size. Inversely, by decreasing the stabilizer concentration, the critical size of the first exposed metal structure and the size of the metal feature to be plated may be increased.

It is also contemplated that the method of the present invention may be used to selectively plate the metal feature on an intermediate structure comprising more than two exposed metal structures of varied size. If the intermediate structure comprises multiple exposed metal structures, with the metal feature to be plated only on one or more, but not all, of those exposed metal structures, the stabilizer concentration may be adjusted so that the metal feature is plated only on the desired exposed metal structures of sufficiently large size. For sake of example only, if four exposed metal structures are present on the intermediate structure, and the metal feature is to be plated on two of those exposed metal structures, the stabilizer concentration may be adjusted so that the metal is only plated on those two exposed metal structures. It is to be understood that the total number of exposed metal structures may be more or less than four and the number of exposed metal structures upon which plating of the metal feature occurs may be altered within the scope of the present invention.

To optimize an electroless plating solution for selectively plating the metal feature on the first exposed metal structure, an electroless plating solution comprising a known concentration of at least one stabilizer is provided. An intermediate structure having two exposed metal structures is placed in the electroless plating solution and the metal feature is electrolessly plated. The intermediate structure is viewed by SEM to determine whether metal of the metal feature is selectively plated on the first exposed metal structure. To reduce copper on passivation around the region of the fuse blow, an etch may be implemented before plating to prevent catalysis of the EN and reduce the risk of reconnecting the fuse. If the first exposed metal structure is not selectively plated, the concentration of stabilizer is adjusted, by increasing or decreasing the concentration, until the metal feature is plated on the first exposed metal structure without plating on the second exposed metal structure.

The method of the present invention may be used to selectively plate the metal feature on the first exposed metal structure without plating the metal on the second exposed metal structure. However, as discussed in more detail below, the method of the present invention may also be used to form the metal feature after probe testing.

In an exemplary embodiment, an intermediate structure of an SRAM or FLASH memory chip is provided. The intermediate structure comprises at least one bond pad as the first exposed metal structure, such as at least one copper bond pad, which is deposited by electroplating or other techniques known in the art. The intermediate structure also comprises at least one fuse as the second exposed metal structure. The at least one fuse is exposed at the wafer level and is preferably metallic. However, the fuse may also comprise polysilicon. The intermediate structure is probe tested for defects and defective regions are rendered nonfunctional by opening the fuses to those defective regions. Preferably, the intermediate structure comprises at least one opened fuse. After the fuse has been opened, the interconnect cap is formed over the at least one copper bond pad to improve bonding thereto. To form the interconnect cap, the at least one copper bond pad is first immersion plated with palladium. Then, a layer of nickel is electrolessly plated over the palladium, followed by immersion plating of a layer of gold to prevent the nickel layer from oxidizing.

To electrolessly plate the nickel, the intermediate structure of the SRAM or FLASH memory chip is placed in an EN plating solution, such as ConPac 2.0, available from Pac Tech (Nauen, Germany). The nickel is plated in a layer approximately 3–5 $\mu$m thick. Other EN plating solutions that plate nickel at an appropriate thickness for use in an interconnect cap may also be used.

The concentration of stabilizer in the electroless plating solution is adjusted to plate the nickel on the copper bond pad without forming nickel on the ends of the opened fuse. The concentration of stabilizer is adjusted by increasing or decreasing the concentration to achieve the desired size of the nickel feature. If a larger nickel feature is desired, the stabilizer concentration is decreased. Inversely, increasing the concentration of stabilizer decreases the size of the nickel feature that will be plated.

Figure 1B:
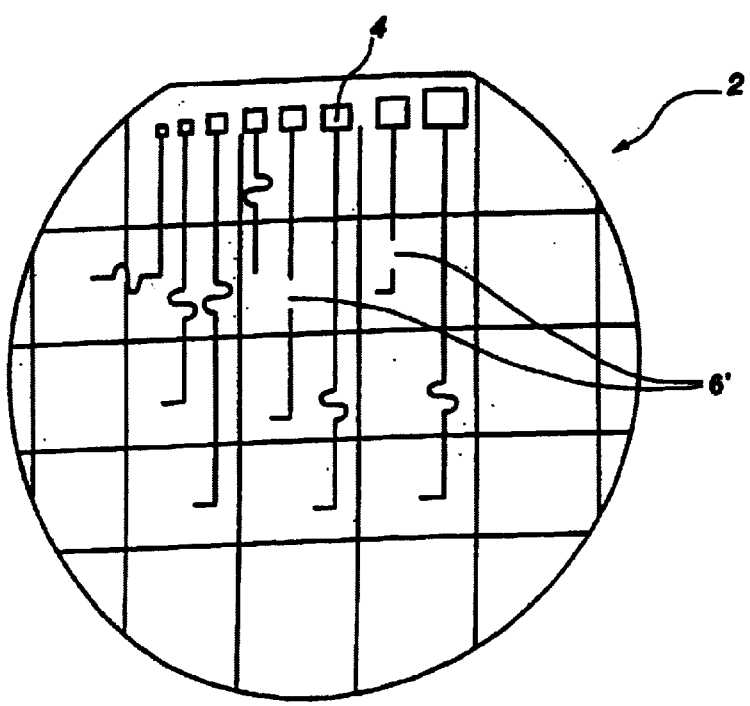

Without being tied to a single theory, it is observed that the selective plating of the nickel on the at least one copper bond pad may be due, in part, to the size differential between the bond pads and the fuses. To determine the size of bond pad that would no longer be selectively plated over the fuses, a size gradient of copper bond pads 4 is formed on a semiconductor wafer 2, as illustrated in FIG. 1A (not drawn to scale). The bond pads on this test structure, semiconductor wafer 2, vary in size from 1–10 $\mu$m squares. The semiconductor wafer 2 also comprises fuses 6. As shown in FIG. 1B (not drawn to scale), a plurality of fuses 6 is opened after probe testing which are illustrated as opened fuses 6'.

The semiconductor wafer 2 comprising the plurality of opened fuses 6' is placed in a solution of ConPac 2.0. After allowing the plating reaction to proceed for an appropriate amount of time, the bond pads 4 and fuses 6 are examined by SEM to determine whether the nickel is selectively plated onto the bond pads 4. For each size of bond pad 4, the amount of nickel plated on the bond pads 4 is compared to the amount formed on the opened fuses. Bond pads 4 larger than approximately 5 μm have a layer of nickel plated on them without nickel forming on the opened fuses.

The present method allows formation of the metal feature after probe testing. Previously, plating of the interconnect cap was performed in a nonclean room, environment before probe, because if the interconnect cap were plated after probe testing, the plated metal would reform any opened fuses. However, by adjusting the concentration of stabilizer, the nickel of the interconnect cap is electrolessly plated without plating any fuses opened during probe testing. By allowing plating of the interconnect cap after probe testing, the present method also reduces contamination of the clean room environment used during probe testing. Since the interconnect cap is plated in a nonclean room environment after probe testing in a clean room environment, potential contamination is reduced.

While the embodiment described above discloses forming an interconnect cap (as the metal feature) on a bond pad (as the first exposed metal structure) using the method of the present invention, it is understood by one of ordinary skill in the art that other metal features, such as RDLs or bond pads, may be formed on the first exposed metal structure using the method of the present invention. Specifically, an RDL comprising a layer of Pd, Ni, and Au may be formed on the first exposed metal structure. Preferably, at least the nickel layer is electrolessly plated according to the present invention.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of selectively forming a metal feature on an intermediate structure of a semiconductor device, said method comprising:
   providing said intermediate structure comprising a first exposed metal structure and a second exposed metal structure; and
   selectively forming said metal feature on said first exposed metal structure without masking the second exposed metal structure and without forming a metal of said metal feature on said second exposed metal structure.

2. The method of claim 1, wherein providing said intermediate structure comprises providing an intermediate structure of one of an SRAM or a FLASH memory chip.

3. The method of claim 1, wherein providing said intermediate structure comprising a first exposed metal structure and a second exposed metal structure comprises providing said intermediate structure comprising at least one bond pad as said first exposed metal structure and at least one opened fuse as said second exposed metal structure.

4. The method of claim 3, wherein selectively forming said metal feature on said first exposed metal structure without forming a metal of said metal feature on said second exposed metal structure comprises forming said metal feature on said at least one bond pad without reforming said at least one opened fuse.

5. The method of claim 1, wherein selectively forming said metal feature on said first exposed metal structure comprises electrolessly plating said metal feature on said first exposed metal structure.

6. The method of claim 1, wherein selectively forming said metal feature on said first exposed metal structure comprises electrolessly plating a metal layer, an interconnect cap, a redistribution layer, or a bond pad on said first exposed metal structure.

7. The method of claim 1, wherein selectively forming said metal feature on said first exposed metal structure comprises adjusting a concentration of stabilizer in an electroless plating solution.

8. The method of claim 1, wherein selectively forming said metal feature on said first exposed metal structure comprises forming said metal feature after probe testing of said intermediate structure of said semiconductor device.

9. The method of claim 1, wherein selectively forming said metal feature on said first exposed metal structure comprises electrolessly plating said metal feature from a metal comprising nickel, palladium, gold, tin, silver, or copper.

10. The method of claim 9, wherein selectively forming said metal feature on said first exposed metal structure comprises electrolessly plating a nickel feature.

11. A method of electrolessly plating a metal feature on an intermediate structure of a semiconductor device, said method comprising:
    providing said intermediate structure comprising a first metal structure and a second metal structure;
    adjusting a concentration of stabilizer in an electroless plating solution; and
    electrolessly plating said metal feature on said first metal structure without masking the second metal structure and without depositing a metal of said metal feature on said second metal structure.

12. The method of claim 11, wherein providing said intermediate structure comprising a first metal structure and a second metal structure comprises providing an intermediate structure of one of an SRAM and a FLASH memory chip.

13. The method of claim 11, wherein providing said intermediate structure comprising a first metal structure and a second metal structure comprises providing said intermediate structure comprising at least one bond pad as said first metal structure and at least one opened fuse as said second metal structure.

14. The method of claim 11, wherein providing said intermediate structure comprising a first metal structure and a second metal structure comprises providing said intermediate structure comprising a first exposed metal structure and a second exposed metal structure.

15. The method of claim 11, wherein electrolessly plating said metal feature on said first metal structure comprises electrolessly plating a metal layer, an interconnect cap, a redistribution layer, or a bond pad on said first metal structure.

16. The method of claim 15, wherein electrolessly plating said metal feature on said first metal structure comprises electrolessly plating said metal feature after probe testing of said intermediate structure of said semiconductor device.

17. The method of claim 11, wherein electrolessly plating said metal feature on said first metal structure comprises electrolessly plating said metal feature from a metal comprising nickel, palladium, gold, tin, silver, or copper.

18. The method of claim 17, wherein electrolessly plating said metal feature on said first metal structure comprises electrolessly plating a nickel feature.

19. The method of claim 11, wherein adjusting a concentration of stabilizer in an electroless plating solution comprises increasing or decreasing said concentration of stabilizer.

20. The method of claim 19, wherein increasing said concentration of stabilizer decreases a critical size of said first metal structure and decreases a size of said metal feature.

21. The method of claim 19, wherein decreasing said concentration of stabilizer increases a critical size of said first metal structure and increases a size of said metal feature.

22. A method of electrolessly plating a metal feature on an intermediate structure of a semiconductor device, said method comprising:
providing said intermediate structure comprising a first metal structure and at least one opened fuse;
adjusting a concentration of stabilizer in an electroless plating solution; and
plating said metal feature on said first metal structure without reforming said at least one opened fuse.

23. The method of claim 22, wherein providing said intermediate structure comprising a first metal structure and at least one opened fuse comprises providing an intermediate structure of an SRAM or a FLASH memory chip.

24. The method of claim 22, wherein providing said intermediate structure comprising a first metal structure and at least one opened fuse comprises providing said intermediate structure comprising at least one bond pad as said first metal structure and said at least one opened fuse.

25. The method of claim 22, wherein providing said intermediate structure comprising a first metal structure comprises providing a first exposed metal structure.

26. The method of claim 22, wherein plating said metal feature comprises electrolessly plating a metal layer, an interconnect cap, a redistribution layer, or a bond pad on said first metal structure.

27. The method of claim 22, wherein plating said metal feature comprises plating said metal feature from a metal comprising nickel, palladium, gold, tin, silver, or copper.

28. The method of claim 27, wherein plating said metal feature comprises plating said metal feature from nickel.

29. The method of claim 22, wherein adjusting a concentration of stabilizer in an electroless plating solution comprises increasing or decreasing said concentration of stabilizer.

30. The method of claim 29, wherein increasing said concentration of stabilizer decreases a critical size of said first metal structure and decreases a size of said metal feature.

31. The method of claim 29, wherein decreasing said concentration of stabilizer increases a critical size of said first metal structure and increases a size of said metal feature.

32. A method of optimizing an electroless plating solution to selectively plate a metal feature on an intermediate structure of a semiconductor device, said method comprising:
providing said electroless plating solution comprising a stabilizer;
electrolessly plating said metal feature on a first metal structure of said intermediate structure;
determining whether said metal feature is selectively plated on said first metal structure; and
adjusting a concentration of said stabilizer to electrolessly plate said metal feature on said first metal structure without forming a metal of said metal feature on at least one opened fuse on said intermediate structure.

33. The method of claim 32, wherein providing said electroless plating solution comprising a stabilizer comprises providing said electroless plating solution comprising a stabilizer selected from the group consisting of compounds of group VI elements, compounds comprising oxygen, heavy metal cations, and unsaturated organic acids.

34. The method of claim 33, wherein said compounds of group VI elements comprise compounds of S, Se, or Te.

35. The method of claim 33, wherein said compounds comprising oxygen comprise compounds of $AsO_2^-$, $IO_3^-$, or $MoO_4^-$.

36. The method of claim 33, wherein said heavy metal cations comprise one of Sn, Pb, Hg, and Sb.

37. The method of claim 33, wherein said unsaturated organic acids comprise one of maleic acid and itaconic acid.

38. The method of claim 32, wherein electrolessly plating said metal feature on a first metal structure of said intermediate structure comprises electrolessly plating said metal feature on a first metal structure of an SRAM or a FLASH memory chip.

39. The method of claim 32, wherein adjusting a concentration of said stabilizer comprises increasing or decreasing said concentration of stabilizer.

40. The method of claim 39, wherein increasing said concentration of stabilizer decreases a critical size of said first metal structure and decreases a size of said metal feature.

41. The method of claim 39, wherein decreasing said concentration of stabilizer increases a critical size of said first metal structure and increases a size of said metal feature.

42. The method of claim 32, wherein determining whether said metal feature is selectively plated on said first metal structure comprises viewing said first metal structure and said at least one opened fuse by scanning electron microscopy to determine whether said metal of said metal feature is deposited on said at least one opened fuse.

* * * * *

UNITED STATES PATENT AND TRADEMARK OFFICE
CERTIFICATE OF CORRECTION

PATENT NO. : 6,709,980 B2
DATED : March 23, 2004
INVENTOR(S) : Jeffery N. Gleason It is certified that error appears in the above-identified patent and that said Letters Patent is hereby corrected as shown below:

Title page,
Item [75], Inventor, change "Jeffrey" to -- Jeffery --.

Column 7,
Line 16, change "room, environment" to -- room environment --.

Signed and Sealed this

Seventh Day of February, 2006

JON W. DUDAS
*Director of the United States Patent and Trademark Office*